US009817065B2

(12) United States Patent
Kim et al.

(10) Patent No.: US 9,817,065 B2
(45) Date of Patent: Nov. 14, 2017

(54) TEST MODE CIRCUIT AND SEMICONDUCTOR DEVICE INCLUDING THE SAME

(71) Applicant: SK hynix Inc., Gyeonggi-do (KR)

(72) Inventors: Bo Kyeom Kim, Gyeonggi-do (KR); Tae Seung Shin, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 272 days.

(21) Appl. No.: 14/738,311

(22) Filed: Jun. 12, 2015

(65) Prior Publication Data
US 2016/0216325 A1    Jul. 28, 2016

(30) Foreign Application Priority Data

Jan. 23, 2015  (KR) .................. 10-2015-0011436

(51) Int. Cl.
  *G11C 29/44*  (2006.01)
  *G01R 31/317*  (2006.01)

(52) U.S. Cl.
  CPC ........ *G01R 31/31701* (2013.01); *G11C 29/44* (2013.01); *G01R 31/31727* (2013.01)

(58) Field of Classification Search
  CPC .. G11C 29/44; G11C 29/04; G01R 31/31701; G01R 31/31727
  See application file for complete search history.

(56) References Cited

U.S. PATENT DOCUMENTS

| 6,163,499 A * | 12/2000 | Suzuki ............. G01R 31/31701 365/189.05 |
| 6,661,735 B2 * | 12/2003 | Lee .......................... G11C 7/22 365/191 |
| 2007/0266286 A1 * | 11/2007 | Tseng ............... G01R 31/31727 714/731 |
| 2008/0005493 A1 * | 1/2008 | Chung ................. G11C 7/1075 711/149 |
| 2008/0224722 A1 * | 9/2008 | Takada ............. G01R 31/31709 324/762.01 |
| 2010/0332925 A1 * | 12/2010 | Lee ......................... G11C 29/46 714/718 |
| 2012/0299606 A1 * | 11/2012 | Oshima ............ G11C 29/56012 324/750.01 |
| 2015/0213907 A1 * | 7/2015 | Lee .................. G11C 29/12015 714/719 |

FOREIGN PATENT DOCUMENTS

| KR | 1020080107305 | 12/2008 |
| KR | 1020100088921 | 8/2010 |

* cited by examiner

*Primary Examiner* — Khamdan Alrobaie
(74) *Attorney, Agent, or Firm* — IP & T Group LLP

(57) ABSTRACT

A test mode circuit of a semiconductor device includes a test mode activating signal generation unit suitable for generating a test mode activating signal in response to a test signal; a test clock generation unit suitable for generating a plurality of test clocks in response to the test mode activating signal and a control clock; a test control signal generation unit suitable for generating test control signals based on the plurality of test clocks of a control signal input cycle, wherein the plurality of test clocks have the control signal input cycle and a data input cycle; and an internal control signal generation unit suitable for generating a plurality of control signals to perform a test operation in response to the test control signals and input data.

24 Claims, 12 Drawing Sheets

111

112

TEST MODE CIRCUIT AND SEMICONDUCTOR DEVICE INCLUDING THE SAME

CROSS-REFERENCE TO RELATED APPLICATION

The present application claims priority to Korean patent application number 10-2015-0011436, filed on Jan. 23, 2015, in the Korean Intellectual Property Office, the entire disclosure of which is incorporated by reference herein.

BACKGROUND

1. Technical Field

Various embodiments relate generally to an electronic device and, more particularly, to a test mode circuit capable of performing a test mode operation and a semiconductor device including the same.

2. Related Art

A semiconductor memory device stores input data and outputs stored data. Semiconductor devices are formed semiconductor materials such as silicon (Si) germanium (Ge), gallium arsenide (GaAs), or indium phosphide (InP). Semiconductor memory devices are classified into volatile memory devices and nonvolatile memory devices.

A volatile memory device loses its stored data without a constant source of power. Volatile memory devices include static random access memory (SRAM) devices, dynamic RAM (DRAM) devices, synchronous DRAM (SDRAM) devices, and the like. A non-volatile memory device retains its stored data even without power. Non-volatile memory includes read only memory (ROM) devices, programmable ROM (PROM) devices, electrically programmable ROM (EPROM) devices, electrically erasable and programmable ROM (EEPROM) devices, flash memory devices, phase-change RAM (PRAM) devices, magnetic RAM (MRAM) devices, resistive RAM (RRAM) devices, ferroelectric RAM (FRAM) devices, and the like. Flash memory devices are classified into two categories, the NOR type and the NAND type.

To screen out semiconductor devices that are defective at the time of production, testing may be performed by connecting a test apparatus to the semiconductor devices through their pads. During testing, multiple pads on each semiconductor device may be connected to the test apparatus. In order to test multiple semiconductor devices with a single test apparatus at the same time, the test operation needs to be performed with a reduced number of pads for each semiconductor device.

BRIEF SUMMARY

Various embodiments relate to a test mode circuit capable of performing a test operation with a reduced number of pads connected to a test apparatus, and a semiconductor device including the same.

A test mode circuit of a semiconductor device according to an embodiment may include a test mode activating signal generation unit suitable for generating a test mode activating signal in response to a test signal; a test clock generation unit suitable for generating a plurality of test clocks in response to the test mode activating signal and a control clock; a test control signal generation unit suitable for generating test control signals based on the plurality of test clocks of a control signal input cycle, wherein the plurality of test clocks have the control signal input cycle and a data input cycle; and an internal control signal generation unit suitable for generating a plurality of control signals to perform a test operation in response to the test control signals and input data.

A test mode circuit of a semiconductor device according to an embodiment may include a test mode activating signal generation unit suitable for generating a test mode activating signal in response to a test signal; a test control signal generation circuit suitable for generating a plurality of test clocks during a control signal input cycle and a data input cycle in response to the test mode activating signal and a control clock, and suitable for generating test control signals based on the plurality of test clocks of the control signal input cycle; and an internal control signal generation unit suitable for generating control signals to perform a test operation in response to the test control signals and input data.

A semiconductor device according to an embodiment may include a memory, a test mode circuit suitable for receiving a test signal, a control clock, and input data through a bonding pad, a control pad, and an input/output pad of the semiconductor device, respectively, and suitable for generating control signals and input data to perform a test operation; and a control logic suitable for performing an operation of the memory according to the control signals and the input data, and outputting a result to a test apparatus.

DETAILED DESCRIPTION

Hereinafter, various examples of embodiments will be described in detail with reference to the accompanying drawings. The figures are provided to allow those with ordinary skill in the art to understand the scope of the embodiments of the invention. The present invention may, however, be embodied in different forms and should not be construed as limited to the embodiments set forth. Rather, these embodiments are provided so that this disclosure will be thorough and complete. In addition, the embodiments are provided to fully convey the scope of the invention to those skilled in the art.

Furthermore, 'connected/coupled' represents that one component is directly electrically coupled to another component or indirectly electrically coupled through another component. A singular form may include a plural form as long as it is not specifically mentioned in a sentence. Furthermore, 'include/comprise' or 'including/comprising' used in the specification represents that one or more components, steps, operations, and elements exists or have been added.

Figure 1:
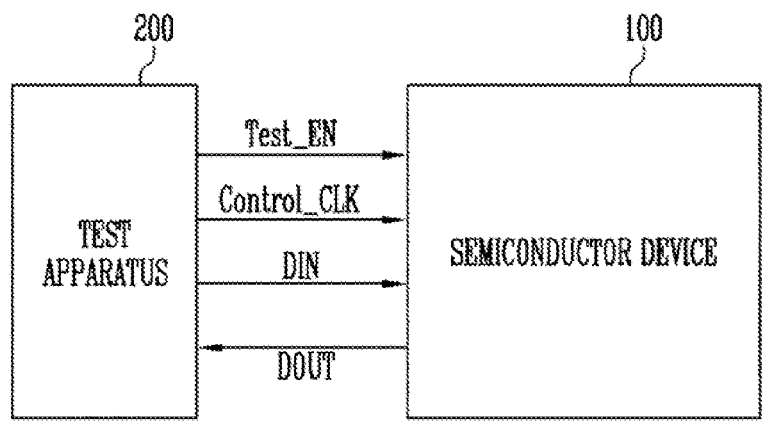
FIG. 1 is a block diagram illustrating a semiconductor device coupled to a test apparatus according to an embodiment.

FIG. 1 is a block diagram illustrating a semiconductor device 100 coupled to a test apparatus 200 according to an embodiment.

Referring to FIG. 1, the semiconductor device 100 may be at a wafer-level. The test apparatus 200 may test the semiconductor device 100. FIG. 1 exemplarily shows a single semiconductor device 100 connected to the test apparatus 200 while a plurality of semiconductor devices 100 may be coupled to the test apparatus 200 so that a test operation may be performed on the plurality of semiconductor devices 100 at the same time.

The test apparatus 200 may output a test enable signal Test_EN, a control clock Control_CLK, and input data DIN to the semiconductor device 100 during a test operation. The semiconductor device 100 may receive the test enable signal Test_EN, the control clock Control_CLK, and the input data DIN, perform the test operation, and output a result as output data DOUT to the test apparatus 200. The test apparatus 200 may analyze the output data DOUT and determine whether the semiconductor device 100 is defective.

The semiconductor device 100 may include a bonding pad, a control pad, and an input/output (IO) pad to receive the test enable signal Test_EN, the control clock Control_CLK, and the input data DIN, respectively.

Figure 2:
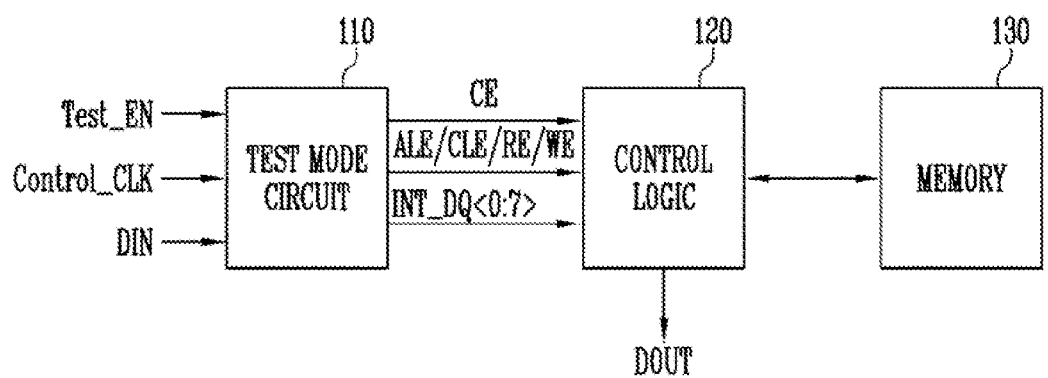
FIG. 2 is a block diagram illustrating a semiconductor device shown in FIG. 1.

FIG. 2 is a block diagram illustrating the semiconductor device 100 shown in FIG. 1.

Referring to FIG. 2, the semiconductor device 100 may include a test mode circuit 110, a control logic 120, and a memory 130.

The test mode circuit 110 may output a chip enable signal CE in response to the test enable signal Test_EN input through the bonding pad, and may output an address latch signal ALE, a command latch signal CLE, a write operation signal WE, a read operation signal RE, and internal input data INT_DQ<0:7> to the control logic 120 in response to the control clock Control_CLK and the input data DIN input through the control pad and the IO pad, respectively.

The control logic 120 may be activated by the chip enable signal CE output from the test mode circuit 110 and determine an operation to perform according to one of the address latch signal ALE, the command latch signal CLE, the write operation signal WE, and the read operation signal RE. In addition, the control logic 120 receive an operation command, an address and actual data through the internal input data INT_DQ<0:7> to control the operation of the memory 130. The control logic 120 may output the output data DOUT as an operation result of the memory 130 to the test apparatus 200 shown in FIG. 1.

The memory 130 may include a plurality of memory cells which store or read data, and perform the operation including a program operation and a read operation in response to control of the control logic 120.

Figure 3:
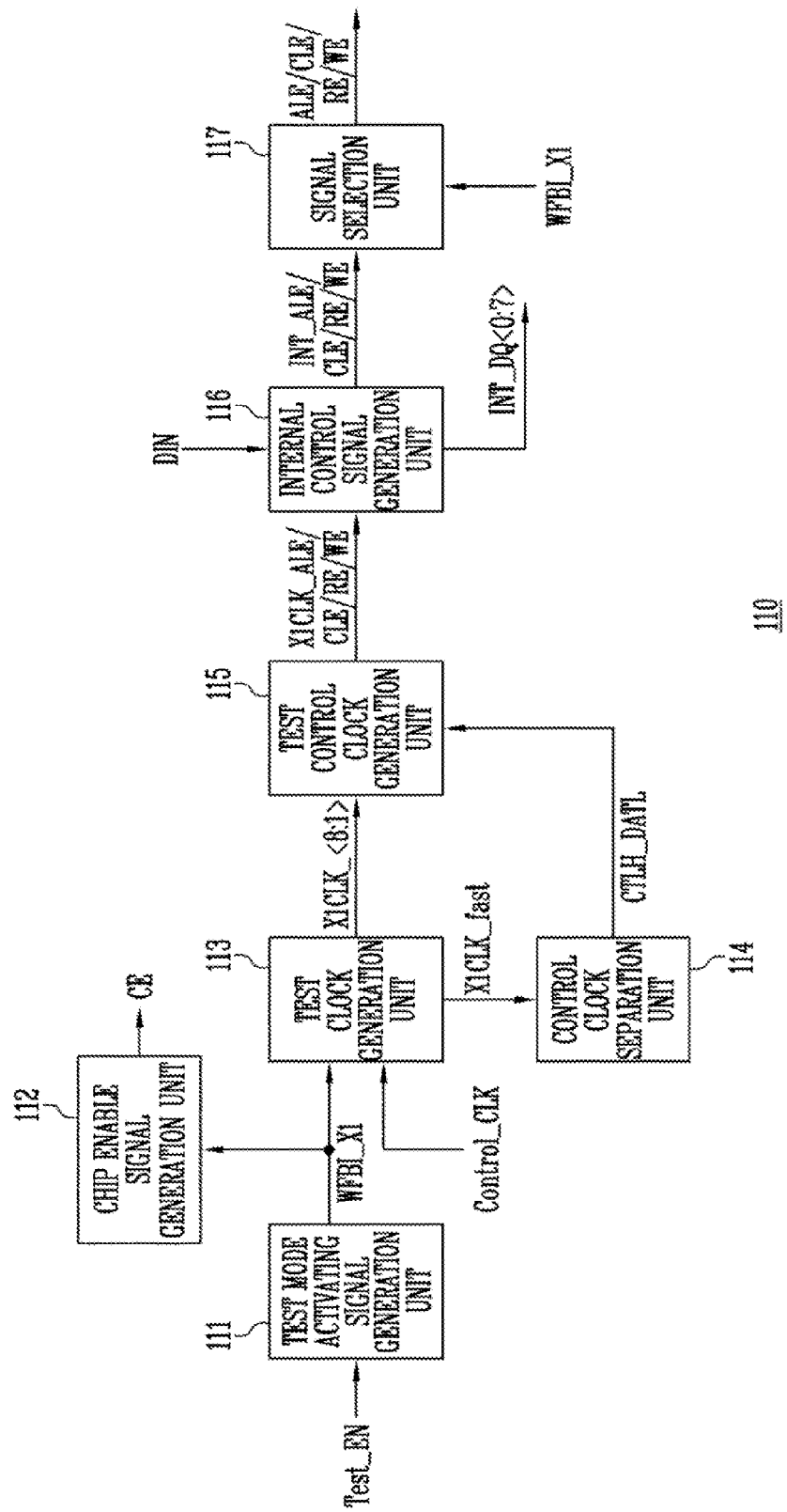
FIG. 3 is a block diagram illustrating a test mode circuit shown in FIG. 2.

FIG. 3 is a block diagram illustrating the test mode circuit 110 shown in FIG. 2.

Referring to FIG. 3, the test mode circuit 110 may include a test mode activating signal generation unit 111, a chip enable signal generation unit 112, a test clock generation unit 113, a control clock separation unit 114, a test control clock generation unit 115, an internal control signal generation unit 116, and a signal selection unit 117.

The test mode activating signal generation unit 111 may generate a test activation signal WFBI_X1 in response to the test enable signal Test_EN input through the bonding pad.

The chip enable signal generation unit 112 may generate the chip enable signal CE, which is an active low signal, in response to the test activation signal WFBI_X1.

The test clock generation unit 113 may generate a plurality of test clocks X1CLK<8.1> and a fast test clock X1CLK_fast in response to the test activation signal WFBI_X1 and the control clock Control_CLK input through the control pad.

The control clock separation unit 114 may output a separation signal CTLH_DATL to define a control signal input cycle from a data input cycle in response to the fast test clock X1CLK_fast. For example, a high level of the separation signal CTLH_DATL may represent the control signal input cycle, and a low level of the separation signal CTLH_DATL may represent the data input cycle.

The test control clock generation unit 115 may output the test control signals X1CLK_ALE/CLE/RE/WE in response to some of the test clocks X1CLK<8:1> during the control signal input cycle defined by the separation signal CTLH_DATL During the control signal input cycle, the test control clock generation unit 115 may output one of the test control signals X1CLK_ALE/CLE/RE/WE in response to a corresponding one of the test clocks X1CLK<8:1> which will be described with reference to FIG. 11.

The internal control signal generation unit 116 may generate one of internal control signals INT_ALE/CLE/RE/WE in response to one of the test control signals X1CLK_ALE/CLE/RE/WE, which is output from the test control clock generation unit 115, and the input data DIN during the control signal input cycle.

In addition, the internal control signal generation unit 116 may generate and output the internal input data INT_DQ<0:7> to the control logic 120 in response to the input data DIN during the data input cycle.

The signal selection unit 117 may receive one of the internal control signals INT_ALE/CLE/RE/WE, which is output from the internal control signal generation unit 116, and output the received signal as the address latch signal ALE, the command latch signal CLE, the write operation signal WE, or the read operation signal RE to the control logic 120 in response to the test activation signal WFBI_X1.

Figure 4:
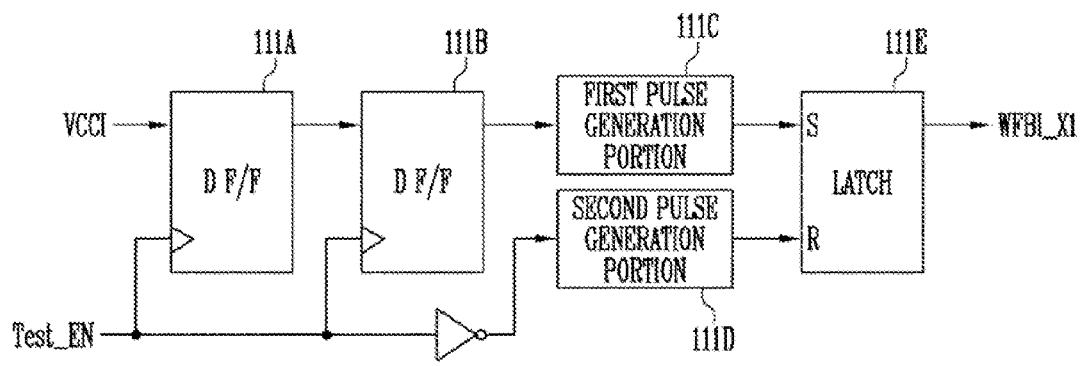
FIG. 4 is a block diagram illustrating a test mode activating signal generation unit shown in FIG. 3.

FIG. 4 is a block diagram illustrating the test mode activating signal generation unit 111 shown in FIG.

Referring to FIG. 4, the test mode activating signal generation unit 111 may include first and second flip-flop portions 111A and 111B, first and second pulse generation portions 111C and 111D, and a latch 111E.

Each of the first and second flip-flop portions 111A and 111B may include a D flip-flop. The first flip-flop portion 111A may receive a power voltage VCCI through a data input node thereof and the test enable signal Test_EN through a clock node thereof to thereby output an output signal. The second flip-flop portion 111B may receive the output signal from the first flip-flop portion 111A through a data input node thereof and the test enable signal Test_EN through a clock node thereof to thereby output an output signal.

The first pulse generation portion 1110 may generate and output a first pulse to the latch 111E in response to the output signal from the second flip-flop portion 111B. The second pulse generation portion 111D may generate and output a second pulse to the latch 111E in response to inversion of the test enable signal Test_EN.

The latch 111E may be an SR latch. The latch 111E may receive the first pulse, generated from the first pulse generation portion 111C, through a set node S thereof, and the second pulse, generated from the second pulse generation portion 111D, through a reset node R thereof to thereby output the test activation signal WFBI_X1.

Figure 5:
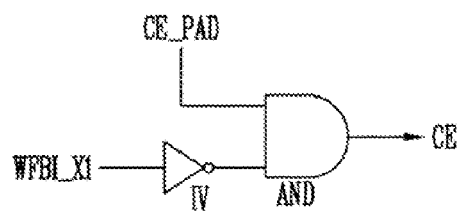
FIG. 5 is a circuit diagram illustrating a chip enable signal generation unit shown in FIG. 3.

FIG. 5 is a circuit diagram of the chip enable signal generation unit 112 shown in FIG. 3.

Referring to FIG. 5, the chip enable signal generation unit 112 may include an inverter IV and an AND gate AND.

The inverter IV may invert the test activation signal WFBI_X1 and output an inverted signal. The AND gate AND may generate the chip enable signal CE, which is an active low signal, in response to an output signal from the inverter IV and a signal input through a chip enable pad CE_PAD.

Figure 6:
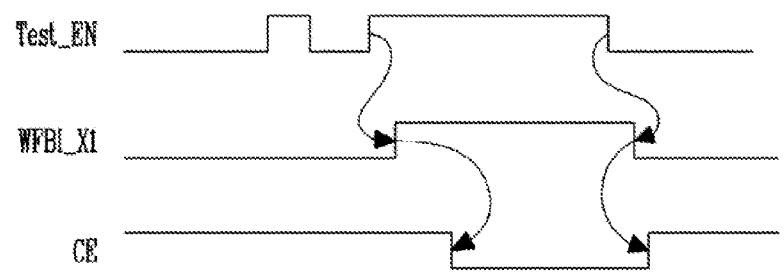
FIG. 6 is a waveform illustrating operations of a test mode activating signal generation unit and a chip enable signal generation unit shown in FIGS. 4 and 5.

FIG. 6 is a waveform illustrating operations of the test mode activating signal generation unit 111 and a chip enable signal generation unit 112 shown in FIGS. 4 and 5.

Referring to FIGS. 4 to 6, when the test enable signal Test_EN is input from the test apparatus 200 shown in FIG. 1, the test mode activating signal generation unit 111 may activate and output the test activation signal WFBI_X1 having a high level when the test enable signal Test_EN toggles once and then has a high level. Therefore, undesirable operation in test mode may be prevented when a power supply is connected to the bonding pad. The chip enable signal generation unit 112 may generate the chip enable signal CE having a low level in response to the test activation signal WFBI_X1 having a high level. The AND gate AND may generate and output the chip enable signal CE having a low level regardless of a signal from the chip enable pad CE_PAD.

Figure 7:
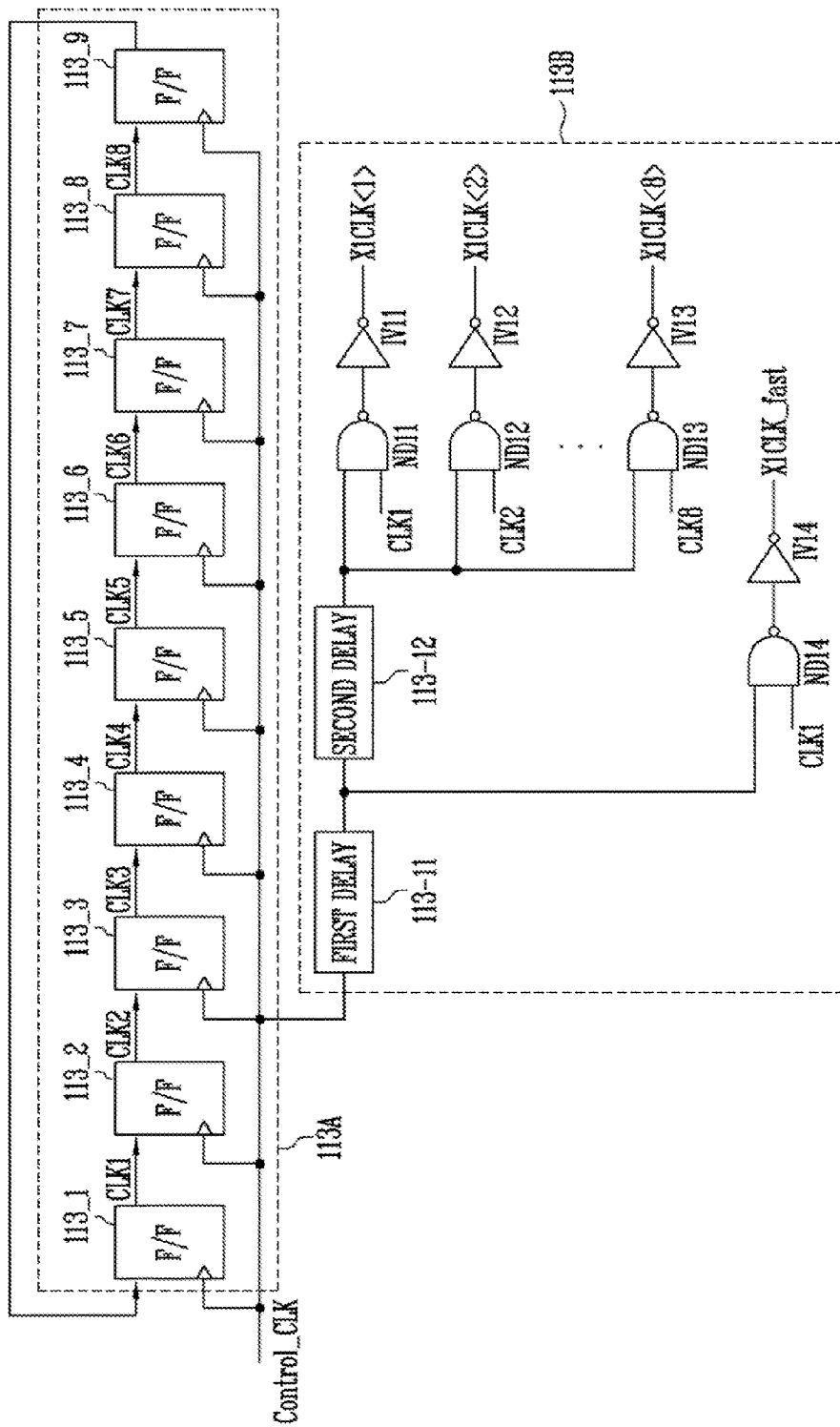
FIG. 7 is a circuit diagram illustrating a test clock generation unit shown in FIG. 3.

FIG. 7 is a circuit diagram illustrating the test clock generation unit 113 shown in FIG. 3.

Referring to FIG. 7, the test clock generation unit 113 may include a sequential clock generation portion 113A and a test clock generation portion 113B.

The sequential clock generation portion 113A may include a plurality of flip-flops 113_1 to 113_9. FIG. 7 exemplarily shows the sequential clock generation portion 113A including nine flip-flops 113_1 to 113_9 to generate eight clocks.

Each of the flip-flops 113_1 to 113_9 may receive the control clock Control_CLK, which toggles at a predetermined interval, through a clock node thereof, and receive an output signal from a flip-flop of the previous stage through a data node thereof, to output a corresponding one of a plurality of clocks CLK1 to CLK8. The first flip-flop 113_1 may receive an output signal from the last flip-flop 113_9 through the data node thereof. Therefore, the sequential clock generation portion 113A may generate the clocks CLK1 to CLK8 which toggle in a sequential manner.

The test clock generation portion 113B may include a first delay 113-11, a second delay 113-12, a plurality of NAND gates ND11 to ND14, and a plurality of inverters IV11 to IV14.

The first delay 113-11 may receive the control clock Control_CLK and output a first delayed clock by delaying the control clock Control_CLK by a predetermined time period. The second delay 113-12 may receive the first delayed clock and output a second delayed clock by delaying the first delayed clock by a predetermined time period.

The NAND gate ND11 may generate an output clock in response to the second delayed clock and the first clock CLK1, among the plurality of clocks CLK1 to CLK8. The inverter IV11 may invert the output clock from the NAND gate ND11 to output a first test clock X1CLK<1>.

The NAND gate ND12 may generate an output clock in response to the second delayed clock and the second clock CLK2, among the plurality of clocks CLK1 to CLK8, and the inverter IV12 may invert the output clock from the NAND gate ND12 to output a second test clock X1CLK<2>.

The NAND gate ND13 may generate an output clock in response to the second delayed clock and the eighth clock CLK8, among the clocks CLK1 to CLK8. The inverter IV13 may invert the output clock from the NAND gate ND13 to output an eighth test clock X1CLK<8>.

In a similar way, the test clock generation portion 113B may output the plurality of test clocks X1CLK<8:1> which toggle in a sequential manner.

The NAND gate ND14 may generate an output clock in response to the first delayed clock and the first clock CLK1. The inverter IV14 may invert the output clock from the NAND gate ND14 to output the fast test clock X1CLK_fast. Therefore, the fast test clock X1CLK_fast may toggle before the plurality of test clocks X1CLK<8:1>.

Figure 8:
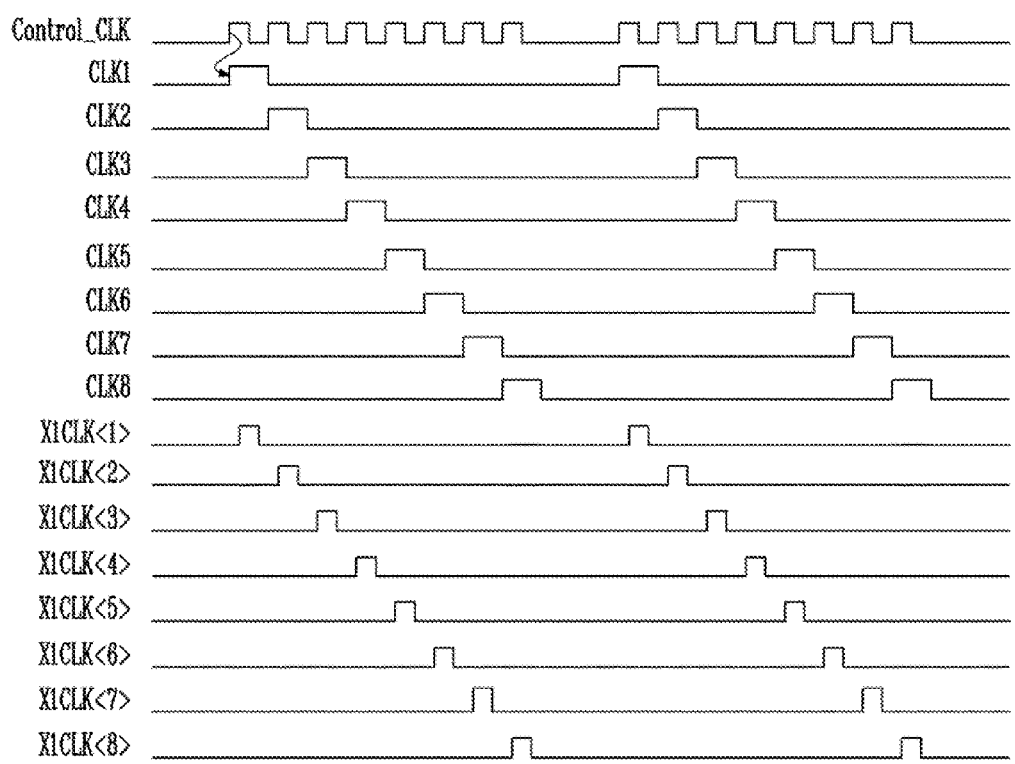
FIG. 8 is a waveform illustrating operations of a test clock generation unit shown in FIG. 7.

FIG. 8 is a waveform illustrating operations of the test clock generation unit 113 shown in FIG. 3.

Referring to FIG. 8, the test clock generation unit 113 may generate the plurality of clocks CLK1 to CLK8 which toggle in a sequential manner according to the control clock Control_CLK which toggles at a predetermined cycle. The predetermined cycle of the control clock Control_CLK may comprise one or more toggles, a number of which is equal to the number of data input through the input/output pad. FIG. 8 exemplarily shows the predetermined cycle of the control clock Control_CLK comprising eight toggles corresponding to eight data input through the input/output pad.

In addition, the test clock generation unit may generate the test clocks X1CLK<8:1> which toggle in a sequential manner in response to the control clock Control_CLK and the clocks CLK1 to CLK8.

Figure 9:
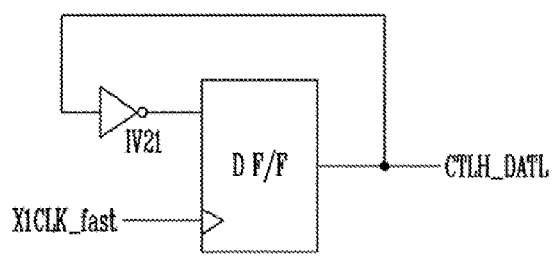
FIG. 9 is a circuit diagram illustrating a control clock separation unit shown in FIG. 3.

FIG. 9 is a circuit diagram illustrating the control clock separation unit 114 shown in FIG. 3.

Referring to FIG. 9, the control clock separation unit 114 may include an inverter IV21 and a D flip-flop D F/F.

The D flip-flop D F/F may receive the fast test clock X1CLK_fast through a clock node thereof to output the separation signal CTLH_DATL. The inverter IV21 may invert the separation signal CTLH_DATL and output the inverted separation signal to a data node of the D flip-flop D F/F.

Figure 10:
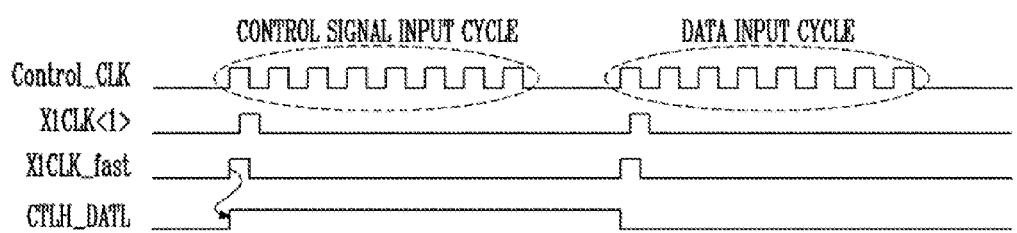
FIG. 10 is a waveform illustrating operations of a control clock separation unit shown in FIG. 9.

FIG. 10 is a waveform illustrating the control clock separation unit 114 shown in FIG. 9.

Referring to FIGS. 9 and 10, the control clock separation unit 114 may output the separation signal CTLH_DATL having a high level, which indicates the control signal input cycle, in response to the fast test clock X1CLK_fast which toggles for the first time, and output the separation signal CTLH_DATL having a low level which indicates the data input cycle in response to the fast test clock X1CLK_fast which toggles for the second time.

Therefore, the first eight toggles of the control clocks Control_CLK may represent the control signal input cycle, and the last eight toggles of the control clocks Control_CLK may represent the data input cycle.

Figure 11:
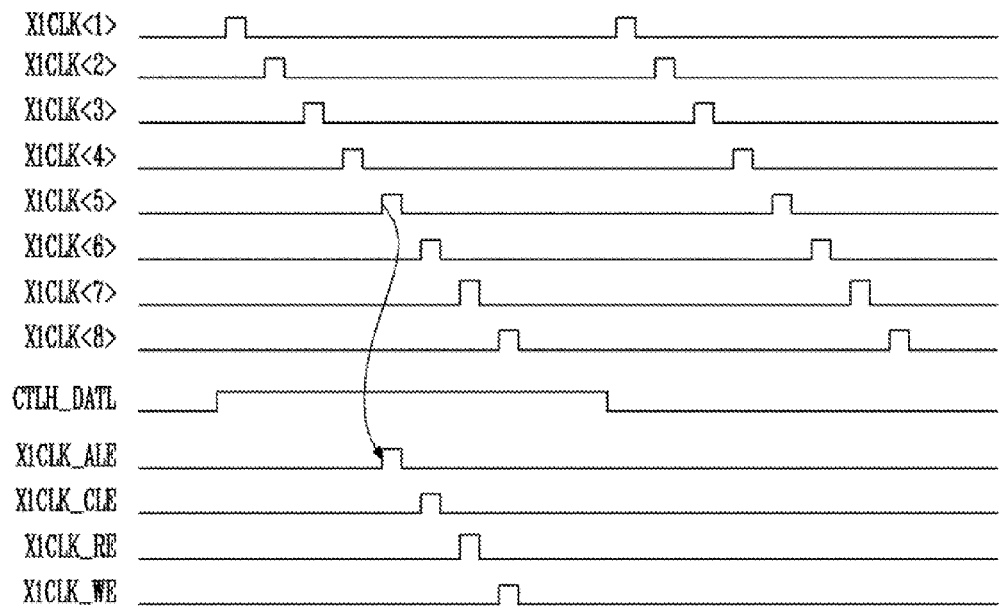
FIG. 11 is a waveform illustrating operations of a test control clock generation unit shown in FIG. 3.

FIG. 11 is a waveform illustrating operations of the test control clock generation unit 115 shown in FIG. 3.

Referring to FIG. 11, the test control clock generation unit 115 may output one of the plurality of test control signals X1CLK_ALE/CLE/RE/WE in response to part of the test clocks X1CLK<8:1> output from the test clock generation unit 113 during the control signal input cycle defined by the separation signal CTLH_DATL having a high level. For example, as shown in FIG. 11, during the control signal input cycle, the test control clock generation unit 115 may output the test control signals X1CLK_ALE, X1CLK_CLE, X1CLK_RE and X1CLK_WE in response to the test clocks X1CLK<5:8>, respectively.

The remaining test clocks X1CLK<4:1>, among the plurality of test clocks X1CLK<8:1> except the test clocks X1CLK<8:5> may be used as a code for a test mode operation. For example, when a bit corresponding to the four test clocks X1CLK<4:1> is the same as a predetermined bit, the test mode circuit may operate in test mode, and otherwise, the test mode circuit may not operate in test mode.

Figure 12:
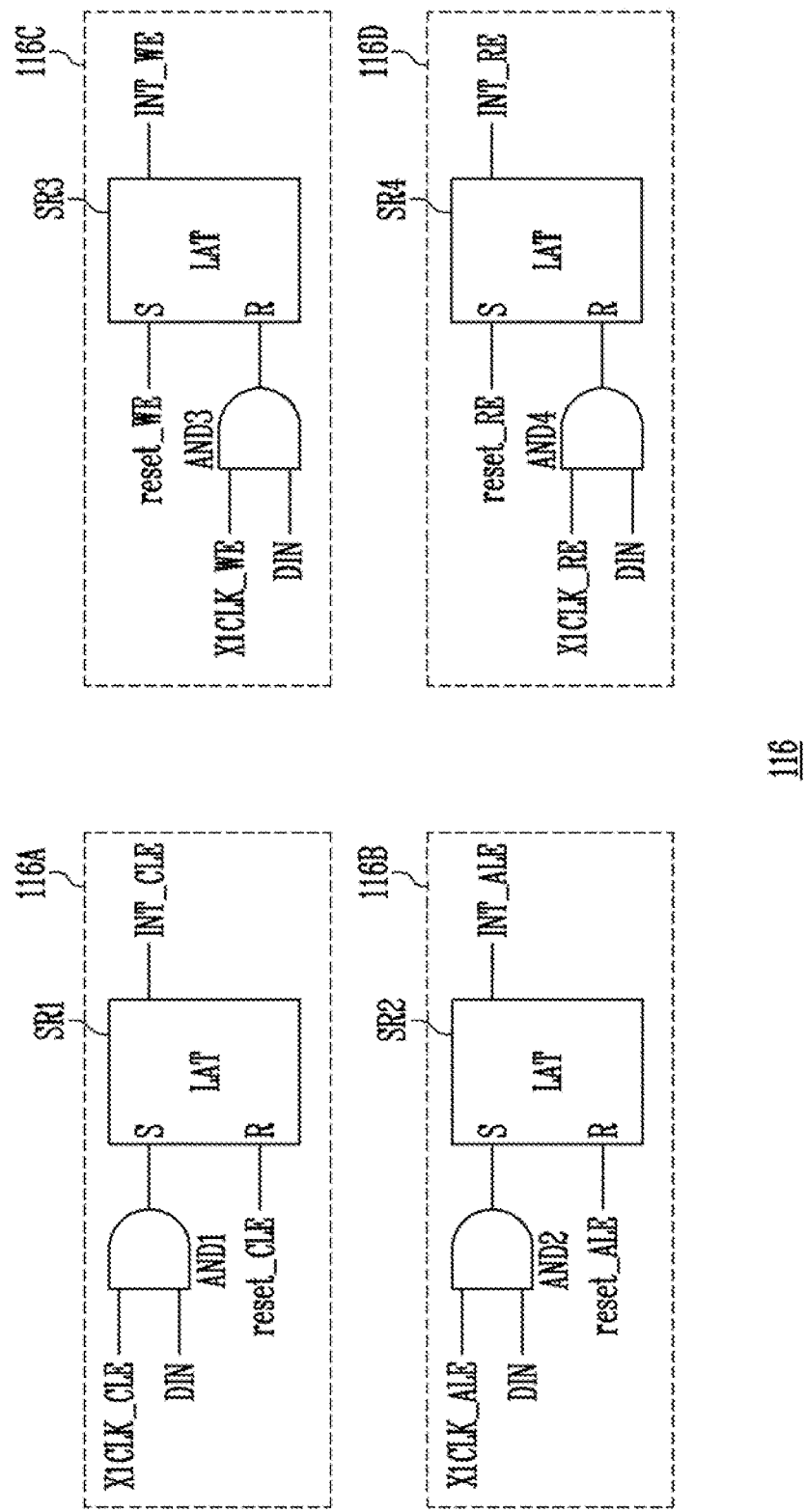
FIG. 12 is a circuit diagram illustrating an internal control signal generation unit shown in FIG. 3.

FIG. 12 is a circuit diagram illustrating the internal control signal generation unit 116 shown in FIG. 3.

Referring to FIG. 12, the internal control signal generation unit 116 may include a plurality of internal control signal generation portions 116A to 116D.

The first internal control signal generation portion 116A may include an AND gate AND1 and a latch SR1. The AND gate AND1 may perform an AND operation on the test control signal X1CLK_CLE and the input data DIN. The latch SR1 may output the internal control signal INT_CLE having a high level in response to an output from the AND gate AND1. In addition, the latch SR1 may initialize the internal control signal INT_CLE to a low level in response to an initialization signal reset_CLE.

The second internal control signal generation portion 116B may include an AND gate AND2 and a latch SR2. The AND gate AND2 may perform an AND operation to the test control signal X1CLK_ALE and the input data DIN. The latch SR2 may output the internal control signal INT_ALE having a high level in response to an output from the AND gate AND2. In addition, the latch SR2 may initialize the internal control signal INT_CLE to a high level in response to an initialization signal reset_ALE.

The third internal control signal generation portion 116C may include an AND gate AND3 and a latch SR3. The AND gate AND3 may perform an AND operation to the test control signal X1CLK_WE and the input data DIN. The latch SR3 may output the internal control signal INT_WE having a low level in response to an output from the AND gate AND3. In addition, the latch SR3 may initialize the internal control signal INT_WE to a high level in response to an initialization signal reset_WE.

The fourth internal control signal generation portion 116D may include an AND gate AND4 and a latch SR4. The AND gate AND4 may perform an AND operation to the test control signal X1CLK_RE and the input data DIN. The latch SR4 may output the internal control signal INT_RE having a low level in response to an output from the AND gate AND4. In addition, the latch SR4 may initialize the internal control signal INT_RE to a high level in response to an initialization signal reset_RE.

Figure 13:
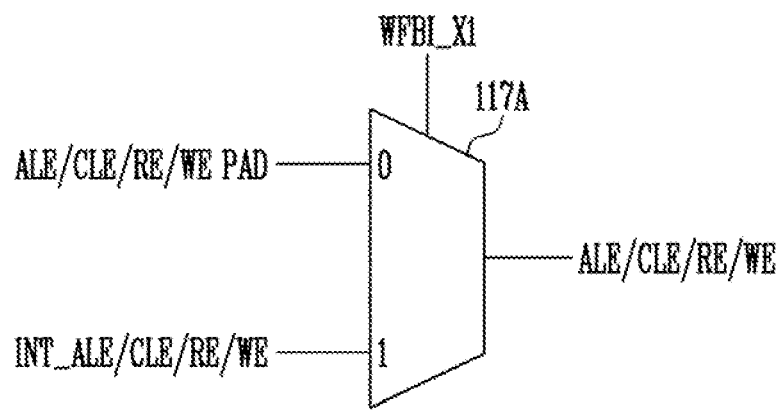
FIG. 13 is a circuit diagram illustrating a signal generation unit shown in FIG. 3.

FIG. 13 is a circuit diagram illustrating the signal selection unit 117 shown in FIG. 3.

Referring to FIG. 13, the signal selection unit 117 may include a multiplexer 117A. For example, during the test operation mode when the test activation signal WFBI_X1 is enabled, the multiplexer 117A may transfer the internal control signals INT_ALE/CLE/RE/WE as the control signal, which includes the address latch signal ALE, the command latch signal CLE, the write operation signal WE, and the read operation signal RE, to the control logic 120 as shown in FIG. 1. For example, during a non-test operation mode when the test activation signal WFBI_X1 is disabled, the multiplexer 117A may transfer control signals, which are input through control signal input pads ALE/CLE/RE/EW PAD, to the control logic 120 as shown in FIG. 1. For example, one of the internal control signals INT_ALE/CLE/RE/WE may be output as the control signal (ALE/CLE/RE/WE) in response to the enabled test activation signal WFBI_X1 during the test operation mode. During the non-test operation mode, the control signals input through the control signal input pads ALE/CLE/RE/EW PAD may be output to the control logic 120.

Figure 14:
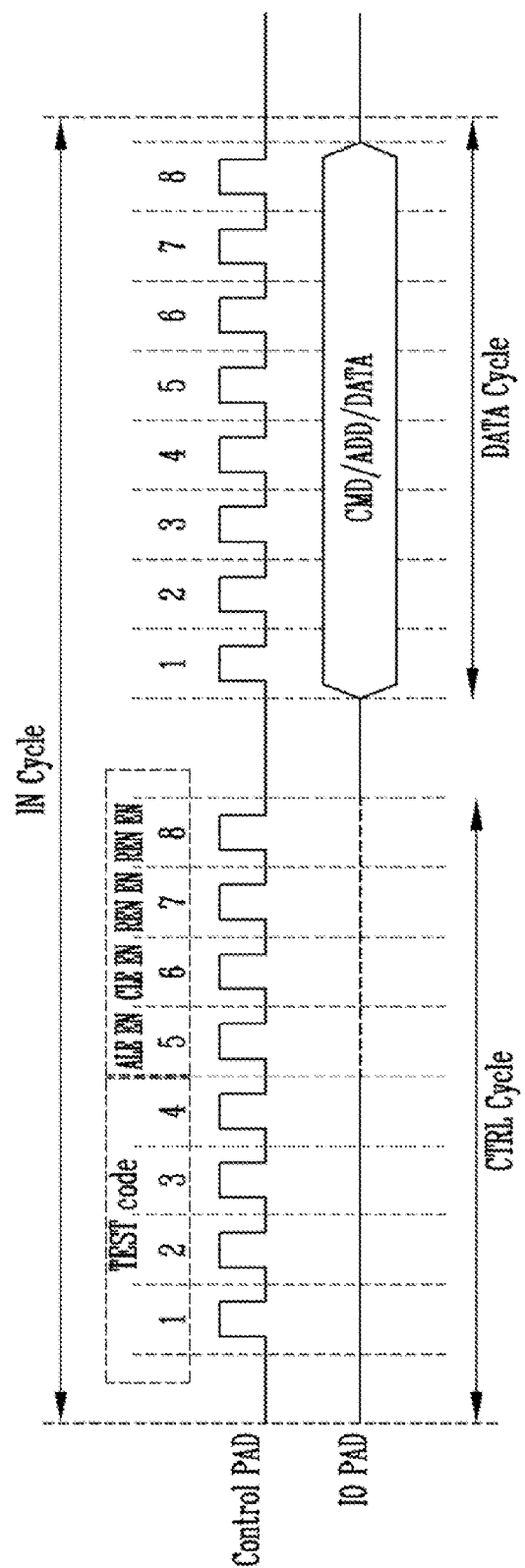
FIG. 14 is a waveform illustrating signals input through a control pad and an input/output pad.

FIG. 14 is a waveform illustrating signals being input through the control pad and the input/output pad.

Referring to FIG. 14, the control clocks Control_CLK which are input through a control pad Control PAD may have a test cycle IN Cycle comprising the control signal input cycle CTRL Cycle and the data input cycle DATA Cycle. For example, during the control signal input cycle CTRL Cycle, first to fourth toggles among a predetermined number (e.g., eight) of toggles of the control clocks Control_CLK may be used as a test code X1 code. Also, the remaining toggles of the control clocks Control_CLK during the control signal input cycle CTRL_Cycle may be used as an ALE enable signal ALE EN, a CLE enable signal CLE EN, an RE enable signal RE EN, and a WE enable signal WE EN. The enable signals may be selected according to a toggle timing of an input signal which is input through the input/output pad IO PAD during the remaining toggles of the control clocks Control_CLK in the control signal input cycle CTRL_Cycle. During the data input cycle DATA Cycle, the control clocks Control_CLK may represent the internal input data, respectively, and each value of the internal input data may be set to 1 or 0 according to the toggle timing of the input signal which is input through the input/output pad IO PAD.

Figure 15:
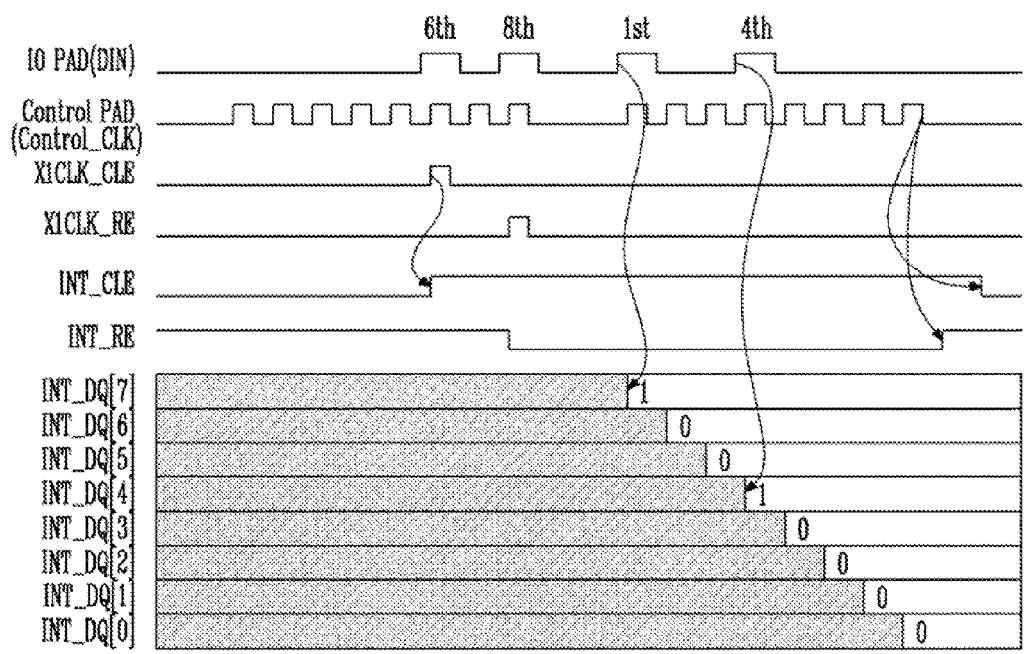
FIG. 15 is a waveform illustrating a test operation of a semiconductor device shown in FIG. 2.

FIG. 15 is a waveform illustrating a test operation of the semiconductor device 100 shown in FIG. 2.

Referring g to FIG. 15, when a write command 90h is input in the test operation mode, the input data DIN may be input through the input/output pad IO PAD at a sixth and eighth toggles of the control clocks Control_CLK during the control signal input cycle CTRL_Cycle. As a result, the test clock X1CLK<6> and the test clock X1CLK<8> may toggle, and the internal control signal INT_CLE and the internal control signal INT_WE may be enabled, so that the semiconductor memory device may perform a write operation.

In addition, the input data DIN may be input through the input/output pad IO PAD at a first and fourth toggles of the control clocks Control_CLK corresponding to the write command 90h during the data input cycle DATA Cycle, and data values of the internal input data INT_DQ[7] and INT_DQ[4] may be set to 1, so that the semiconductor memory device may perform the write operation.

As described above, a test operation semiconductor device may be performed by using a bonding pad through which the test enable signal Test_EN is input, a control pad through which a control clock is input, and an input/output pad through which the input data is input, to reduce the number of pads used for the test operation, so that a plurality of semiconductor devices may be tested at the same time. Therefore, time and cost consumed by the test operation relay be reduced.

Figure 16:
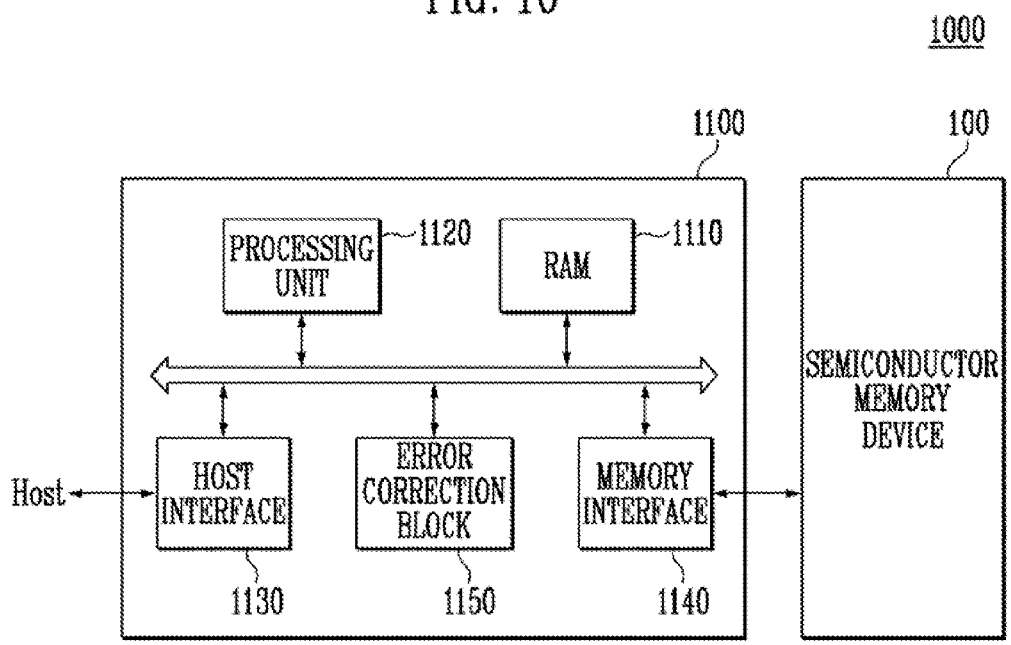
FIG. 16 is a block diagram illustrating a memory system including a semiconductor device shown in FIG. 2.

FIG. 16 is a block diagram illustrating a memory system including the semiconductor device 100 shown in FIG. 2.

As illustrated in FIG. 16, a memory system 1000 according to an embodiment may include a semiconductor device 100 and a controller 1100.

The semiconductor device 100 may be configured and operated in the above-described manner. Thus, a detailed description thereof will be omitted.

The controller 1100 may be coupled to a host and the semiconductor device 100. The controller 1100 may access the semiconductor device 100 in response to requests of the host. For example, the controller 1100 may control a read operation, a program operation, an erase operation, and/or a background operation of the semiconductor device 100. The controller 1100 may provide an interface between the semiconductor device 100 and the host. The controller 1100 may be configured to drive firmware for controlling the semiconductor device 100.

The controller 1100 may include a random access memory (RAM) 1110, a processing unit 1120, a host interface 1130, a memory interface 1140 and an error correction block 1150. The RAM 1110 may be used as at least one of the operation memories of the processing unit 1120, a cache memory between the semiconductor device 100 and the host, and/or a buffer memory between the semiconductor device 100 and the host. The processing unit 1120 may control operations of the controller 1100. In addition, the controller 1100 may temporarily store program data provided from the host during a write operation.

The host interface 1130 may include a protocol for exchanging data between the host and the controller 1100. For example, the controller 1100 may communicate with the host through at least one of various protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The memory interface 1140 may interface with the semiconductor device 100. For example, the memory interface may include a NAND flash interface or a NOR flash interface.

The memory system 1000 may further include an error correction block 1150. The error correction block 1150 may detect and correct errors in data read from the semiconductor device 100 by using an error correction code (ECC). For example, the error correction block 150 may be included in the controller 1100. The processing unit 1120 may control a read voltage in response to an error detection result of the error correction block 150 and control the semiconductor device 100 to perform a re-read operation.

The controller 1100 and the semiconductor device 100 may be integrated in one semiconductor device. For example, the controller 1100 and the semiconductor device 100 may be integrated in a single semiconductor device to form a memory card such as a PC card (personal computer memory card international association (PCMCIA)), a compact flash card (CF), a smart media card (SMC), a memory stick, a multimedia card (MMC, RS-MMC or MMCmicro), an SD card (SD, miniSD, micro SD or SDRC), a universal flash storage device (UFS), etc.

In another example, the controller 1100 and the semiconductor device 100 may be integrated as a solid state drive (SSD). The SSD may include a storage device for storing data in a semiconductor memory. When the memory system 1000 is used as an SSD, operational rates of the host coupled to the memory system 1000 may be significantly improved.

The memory system 1000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

The semiconductor device 100 or the memory system 1000 may be packaged in various forms. For example, the semiconductor device 100 or the memory system 1000 may be packaged by various methods such as a package on package (PoP), a ball grid arrays (BGAs), a chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multi chip package (MCP), a wafer-level fabricated package (WFP), a wafer-level processed stack package (WSP), etc.

Figure 17:
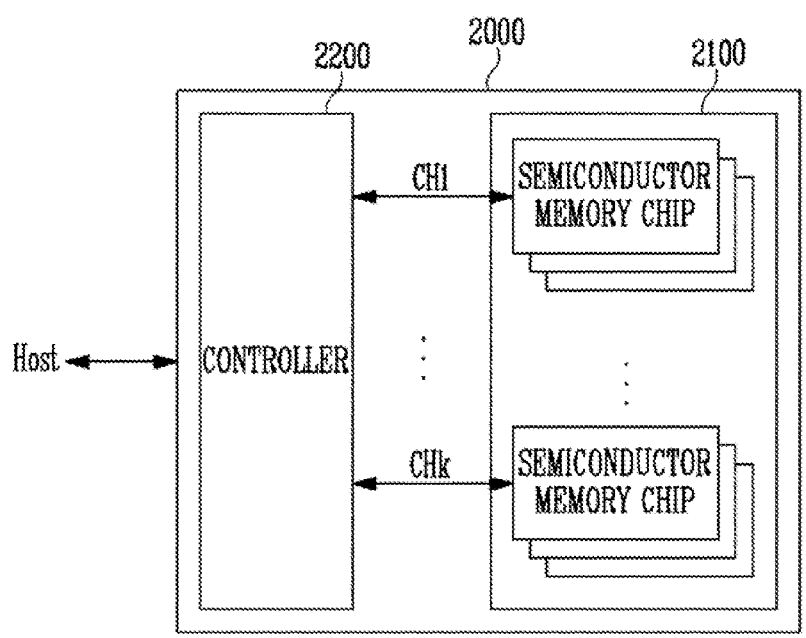
FIG. 17 is a block diagram illustrating an application example of a memory system shown in FIG. 16.

FIG. 17 is a block diagram illustrating an application example of the memory system 1000 shown in FIG. 16.

Referring to FIG. 17, a memory system 2000 may include a semiconductor memory device 2100 and a controller 2200. The semiconductor memory device 2100 may include semiconductor memory chips. The semiconductor memory chips may be divided into groups.

FIG. 17 illustrates the groups communicating with the controller 2200 through first to k-th channels CH1 to CHk. Each of the semiconductor memory chips may be configured and operated in substantially the same manner as the semiconductor device 100 described above with reference to FIG. 1.

Each of the groups may communicate with the controller 2200 through a single common channel. The controller 2200 may be configured in substantially the same manner as the controller 1100 described with reference to FIG. 16, and configured to control the plurality of memory chips of the semiconductor memory device 2100.

Figure 18:
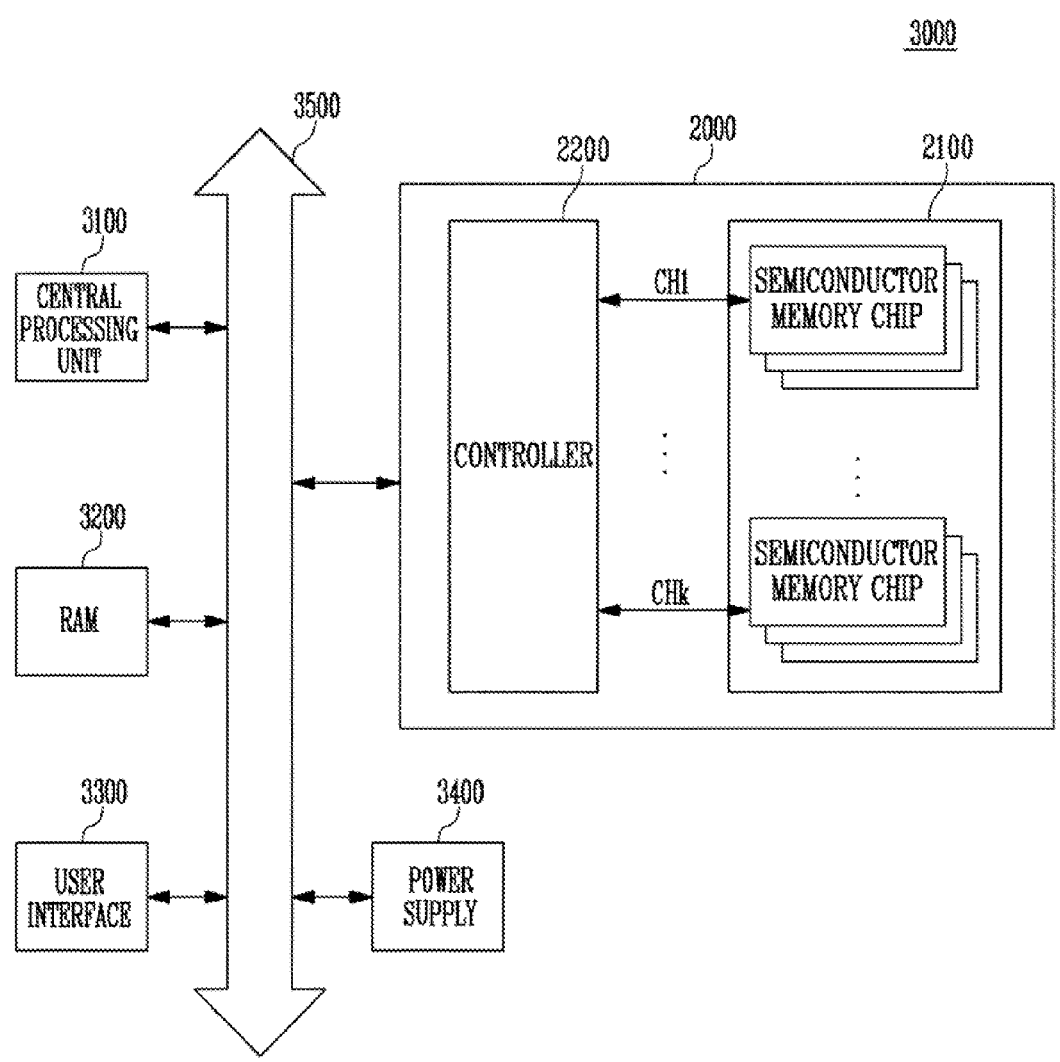
FIG. 18 is a block diagram illustrating a computing system including a memory system shown FIG. 17.

FIG. 18 is a block diagram illustrating a computing system 3000 having the memory system 2000 shown in FIG. 17.

Referring to FIG. 18, the computing system 3000 may include a central processing unit 3100, a random access memory (RAM) 3200, a user interface 3300, a power supply 3400, a system bus 3500, and a memory system 2000.

The memory system 2000 may be electrically connected to the central processing unit 3100, the RAM 3200, the user interface 3300 and the power supply 3400 through the system bus 3500. Data provided trough the user interface 3300 or processed by the central processing unit 3100 may be stored in the memory system 2000.

In FIG. 18, the semiconductor memory device 2100 may be coupled to the system bus 3500 through the controller 2200. In some embodiments the semiconductor memory device 2100 may be directly coupled to the system bus 3500. The central processing unit 3100 and the RAM 3200 may perform functions of the controller 2200.

As illustrated in FIG. 18, the memory system 2000 shown in FIG. 17 may be included in the memory system 3000. However, in some embodiments, the memory system 2000 may be replaced with the memory system 1000 shown in FIG. 16. In some embodiments, the computing system 3000 may include both the memory systems 1000 and 2000 described above with reference to FIGS. 16 and 17, respectively.

According to an embodiment a plurality of operation command signals and data may be generated during a test operation of a semiconductor device by using a bonding pad through which a test mode activating signal is input, a control pad through which a control clock is input, and an input/output pad through which data is input, so that a plurality of semiconductor devices may be tested at the same time during the test operation, thereby reducing time and cost of the test operation.

What is claimed is:

1. A test mode circuit of a semiconductor device, the test mode circuit comprising:
   a test mode activating signal generation unit configured to generate a test mode activating signal in response to a test signal;
   a test clock generation unit configured to generate a plurality of test clocks in response to the test mode activating signal and a control clock;
   a test control signal generation unit configured to generate test control signals based on the plurality of test clocks of a control signal input cycle, wherein the plurality of test clocks have the control signal input cycle and a data input cycle; and
   an internal control signal generation unit configured to generate a plurality of control signals to perform a test operation in response to the test control signals and input data.

2. The test mode circuit of claim 1, wherein the internal control signal generation unit generates one or more of the plurality of control signals in response to the input data.

3. The test mode circuit of claim 2, wherein the test mode circuit receives the test signal, the control clock, and the input data through a bonding pad, a control pad, and an input/output pad of the semiconductor device, respectively.

4. The test mode circuit of claim 1, wherein the test clock generation unit further generates a fast test clock toggling before the plurality of test clocks in response to the control clock.

5. The test mode circuit of claim 4, wherein the test clock generation unit comprises:
   a sequential clock generation unit configured to generate N clocks toggling in a sequential manner, where N is a natural number; and
   a test clock generation unit configured to venerate the plurality of test clocks and the fast test clock by synchronizing the N clocks with the control clock.

6. The test mode circuit of claim 5,
   wherein the sequential clock generation unit includes N+1 flip-flop portions coupled in series, and
   wherein each of the N+1 flip-flop portions generates one of the N clocks in response to an output signal from a flip-flop portion at a previous stage and the control clock.

7. The test mode circuit of claim 4, further comprising a control clock separation unit configured to generate a separation signal representing the control signal input cycle and the data input cycle in response to the fast test clock.

8. The test mode circuit of claim 7, wherein the test control signal generation unit generates the test control signals in response to part of the plurality of test clocks of the control signal input cycle represented by the separation signal.

9. The test mode circuit of claim 8, wherein test mode circuit receives the rest of the plurality of test clocks as a code to enter a test operation mode.

10. The test mode circuit of claim 1,
    wherein the internal control signal generation unit includes a plurality of internal control signal generation units, and
    wherein each of the plurality of internal control signal generation units generates and outputs one of a plurality of internal control signals in response to a corresponding one of the test control signals and the input data.

11. The test mode circuit of claim 10, wherein each of the internal control signal generation units comprises:
    a logic gate generating an output signal in response to one of the test control signals and the input data; and
    an SR latch generating and outputting one of the internal control signals in response to the output signal from the logic gate.

12. The test mode circuit of claim 1, further comprising a signal selection unit outputting the control signals to an internal circuit in response to the test mode activating signal.

13. The test mode circuit of claim 1, wherein the internal control signal generation unit generates and outputs internal input data in response to input data of the data input cycle.

14. A test mode circuit of a semiconductor device, the test mode circuit comprising:
    a test mode activating signal generation configured to generate a test mode activating signal in response to a test signal;
    a test control signal generation circuit configured to generate a plurality of test clocks during a control signal input cycle and a data input cycle in response to the test mode activating signal and a control clock, and configured to generate test control signals based on the plurality of test clocks of the control signal input cycle; and
    an internal control signal generation unit configured to generate control signals to perform a test operation in response to the test control signals and input data.

15. The test mode circuit of claim 14, wherein the test control signal generation circuit comprises:
    a test clock generation unit configured to generate the plurality of test clocks and a fast test clock in response to the test mode activating signal and the control clock;

a control clock separation unit configured to generate a separation signal representing the control signal input cycle and the data input cycle in response to the fast test clock; and a test control signal generation unit configured to generate the test control signals based on the plurality of test clocks of the control signal input cycle.

16. The test mode circuit of claim 14, wherein the internal control signal generation unit generates and outputs internal input data in response to the input data of the data input cycle.

17. The test mode circuit of claim 14, wherein the test mode circuit receives the test signal, the control clock, and the input data through a bonding pad, a control pad, and an input/output pad of the semiconductor device, respectively.

18. The test mode circuit of claim 14, further comprising a signal selection unit outputting the control signals to an internal circuit in response to the test mode activating signal.

19. The test mode circuit of claim 14, wherein each of the internal control signal generation units comprises:

a logic gate generating an output signal in response to one of the test control signals and the input data; and an SR latch generating and outputting one of a plurality of internal control signals in response to the output signal from the logic gate.

20. The test mode circuit of claim 14, further comprising a chip enable signal generation unit configured to generate a chip enable signal in response to the test mode activating signal.

21. A semiconductor device, comprising:

a memory;

a test mode circuit configured to receive a test signal, a control clock, and input data through a bonding pad, a control pad, and an input/output pad of the semiconductor device, respectively, and configured to generate control signals and input data to perform a test operation; and a control logic configured to perform an operation of the memory according to the control signals and the input data, and outputting a result to a test apparatus, wherein the test mode circuit comprises:

a test mode activating signal generation unit configured to generate a test mode activating signal in response to the test signal;

a test clock generation unit configured to generate a plurality of test clocks in response to the test mode activating signal and the control clock;

a test control signal generation unit configured to generate test control signals based on the plurality of test clocks of a control signal input cycle, wherein the plurality of test clocks have the control signal input cycle and a data input cycle; and an internal control signal generation unit configured to generate control signals to perform a test operation in response to the test control signals and input data.

22. The semiconductor device of claim 21, wherein the internal control signal generation unit generates one or more of the control signals in response to the input data.

23. The semiconductor device of claim 21, wherein the test clock generation unit further generates a fast test clock toggling before the test clocks in response to the control clock.

24. The semiconductor device of claim 23, wherein the test mode circuit further includes a control clock separation unit configured to generate a separation signal representing the control signal input cycle and the data input cycle in response to the fast test clock.

* * * * *